(12) United States Patent
Bertschmann et al.

(10) Patent No.: US 7,110,485 B2
(45) Date of Patent: Sep. 19, 2006

(54) SYSTEM AND METHOD FOR CLOCK SYNCHRONIZATION OF MULTI-CHANNEL BAUD-RATE TIMING RECOVERY SYSTEMS

(75) Inventors: Roger Kevin Bertschmann, Calgary (CA); Saeid Sadeghi, Kanata (CA)

(73) Assignee: STMicroelectronics, Inc., Carrollton, TX (US)

( * ) Notice: Subject to any disclaimer, the term of this patent is extended or adjusted under 35 U.S.C. 154(b) by 739 days.

(21) Appl. No.: 10/256,991

(22) Filed: Sep. 26, 2002

(65) Prior Publication Data

US 2004/0062333 A1    Apr. 1, 2004

(51) Int. Cl.
*H03D 3/24* (2006.01)
*H04L 7/00* (2006.01)
*H03L 7/06* (2006.01)

(52) U.S. Cl. .................. 375/375; 375/356; 327/155

(58) Field of Classification Search ............... 375/354, 375/371, 373, 375, 377, 356; 370/516, 503, 370/498, 464, 517; 714/700, 699; 327/141, 327/155

See application file for complete search history.

(56) References Cited

U.S. PATENT DOCUMENTS 5,952,888 A    9/1999  Scott
6,016,080 A *  1/2000  Zuta et al. ................. 331/25
6,307,906 B1  10/2001  Tanji et al.
6,438,178 B1 * 8/2002  Lysdal et al. ............. 375/317
6,526,112 B1 * 2/2003  Lai .......................... 375/376
2002/0012152 A1 * 1/2002 Agazzi et al. .......... 359/189
2002/0094047 A1  7/2002 Agazzi

FOREIGN PATENT DOCUMENTS

EP           901126 A1 *  3/1999

OTHER PUBLICATIONS

Hatamian, et al., "Design Considerations for Gigabit Ethernet 1000Base-T Twisted Pair Transceivers," Custom Integrated Circuits Conference 1998; Proceedings of the IEEE 1998 Santa Clara, CA, US, May 11-14, 1998, New York, US, pp. 335-342, dated May 11, 1998, XP010293978, ISBN: 0-7803-4292-5.
European Search Report, EP 03 25 5932, dated Sep. 28, 2005.

* cited by examiner

*Primary Examiner*—Tesfaldet Bocure
*Assistant Examiner*—Vineeta S. Panwalkar
(74) *Attorney, Agent, or Firm*—Lisa K. Jorgenson; Andre M. Szuwalski

(57) ABSTRACT

A clock control circuit for use in a multi-channel baud-rate timing recovery loop includes a control circuit responsive to a phase error signal from at least one phase detector for generating at least one clock control signal, wherein said control circuit propagates adjustments required for frequency correction in a synchronous fashion across all of the N-channels.

24 Claims, 2 Drawing Sheets

SYSTEM AND METHOD FOR CLOCK SYNCHRONIZATION OF MULTI-CHANNEL BAUD-RATE TIMING RECOVERY SYSTEMS

BACKGROUND OF THE INVENTION

1. Technical Field of the Invention

The present invention relates to clock synchronization, and more particularly, to clock synchronization between transmitters and receivers within a multi-channel baud-rate timing recovery system

2. Description of the Related Art

The process of baud-rate timing recovery involves determining a frequency and phase of incoming signals through the use of samples (normally provided by an A/D converter) acquired at the same rate as the incoming data is transmitted. Traditional single channel baud-rate timing recovery systems use a phase detector which drives a loop filter as shown in FIG. 1. The incoming signal 10 is provided to an A/D converter 15, which generates samples of the input signal 10 that are provided to a phase detector 20. The phase detector operates in conjunction with other signal processing elements 22 such as Feed-forward and Decision-Feedback Equalizers and a data slicer in order to provide a phase error signal. The phase error signal is forwarded from the phase detector 20 to a loop filter 25. The output of the loop filter 25 is used to control the output of a voltage-controlled oscillator 30. The output signal of the voltage-controlled oscillator 30 is used as a clock signal to control the sample rate of the A/D converter 15. The goal of the timing recovery loop is to lock on to a remote signal and through acquiring the frequency and phase of the remote signal provide baud-rate A/D converter samples at the optimum sampling period.

In a loop-timed system such as that described above, there exists a master and a slave device as shown in FIG. 2. The master provides the reference timing for the system and the slave must synchronize itself to the master's frequency and phase on one or a plurality of channels. In the case of duplex systems, such as those described by the IEEE 802.3ab 1000Base-T standard, the slave must transmit back to the Master using the acquired timing on one or a plurality of channels. A typical master or slave system will have ECHO cancellers which mitigate the effects of the local transmit signal on the local receive signal. Multi-channel master or slave systems will additionally have Near End Crosstalk (NEXT) Cancellers and Far End Crosstalk (FEXT) Cancellers which mitigate the effects of adjacent transmitters on the local receivers.

In a single channel baud type slave system, the synchronization of the local Receive (Rx) and Transmit (Tx) clock is required so that frequency synchronization (i.e., loop timing) is achieved between the master and slave. The synchronization of the Receive and Transmit clocks also mitigates the problem of ECHO/NEXT canceller misadjustment. This canceller misadjustment occurs when the Rx and Tx clock phases change relative to each other requiring the canceller taps to be readapted. Canceller misadjustment causes a short term increase in the noise of the receiver system and hence results in a poorer quality of data reception.

In a multi-channel slave system, the issue of Receive and Transmit clock synchronization is much more difficult. Each slave Receive/Transmit pair could be synchronized to each other (i.e., TXCLK1=RSCLK1, TXCLK2=RXCLK2, etc.), or an alternative method can be devised wherein all Transmit clocks are synchronous and are in turn synchronized with the frequency of the Receive clocks. The IEEE 802.3ab specification dictates that the latter of these two methods be used in a Phy receiver. This specification creates difficulties for baud-rate timing recovery systems as the synchronization of the four Transmit clocks to each other rather than to each Receive channel causes ECHO/NEXT canceller misadjustment Thus, an improved method of synchronization within multi-channel slave systems would be desirable.

SUMMARY OF THE INVENTION

The present invention overcomes the foregoing and other problems with a frequency synchronization circuit for use in a multi-channel baud-rate timing recovery loop including first circuitry for generating a proportional output responsive to an input from at least one phase detector. Second circuitry generates an integrating output responsive to an input from at least one phase detector. A plurality of resettable phase error integrators are connected to the first and second circuitry to accumulate outputs until a programmable threshold is reached. The plurality of resettable phase error integrators output a pulse and reset responsive to reaching said programmable threshold levels A plurality of Mod-N integrators generate a clock control signal for selecting an N sampling phase of a digitally controlled oscillator connected thereto. The clock-controlled signal is generated responsive to outputs of the plurality of resettable phase error integrators.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION

Figure 1:
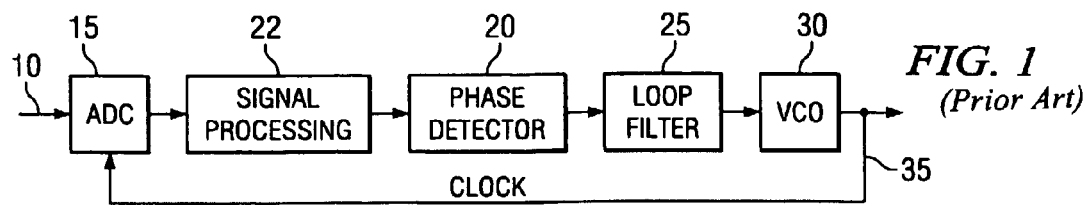
FIG. 1 is a block diagram of a baud-rate timing recovery loop.
Figure 2:
FIG. 2 is a block diagram of a master slave device.
Figure 3:
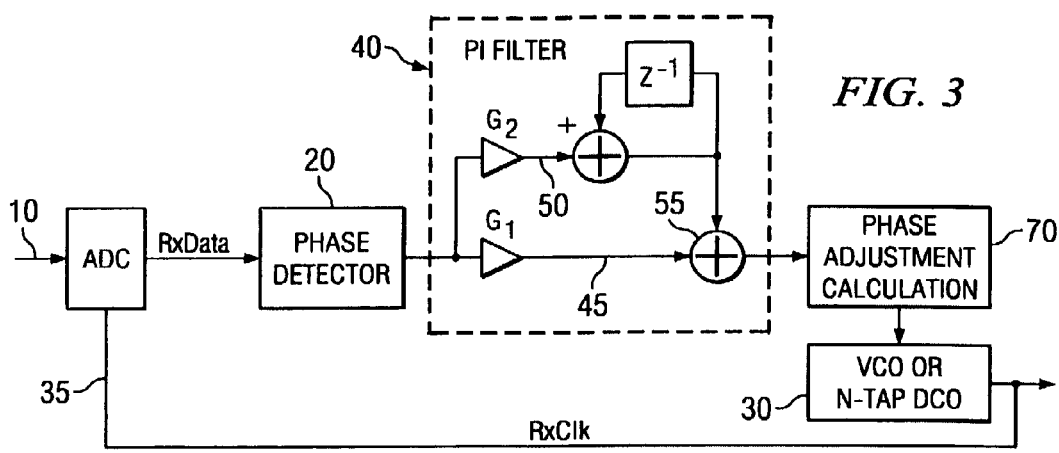
FIG. 3 is a more detailed diagram of a baud-rate timing recovery loop.

Referring now to the drawings, and more particularly to FIG. 3, there is illustrated a detailed diagram of a baud-rate timing recovery loop. A received input signal 10 is provided to an A/D converter 15, which samples a signal in accordance with a provided clock signal 35 Phase detector 20 receives output samples from the A/D converter 15 and generates a phase error signal, which is provided to a PI (proportional and integrating) loop filter 40. The outputs of the proportional arm 45 and the integrating arm 50 are summed together at a summer 55 and provided as input to phase adjustment calculation circuitry 70 which calculates a phase adjustment signal for a voltage controlled oscillator 30. The voltage-controlled oscillator 30 generates the clock signal 35 responsive to the input.

Figure 4:
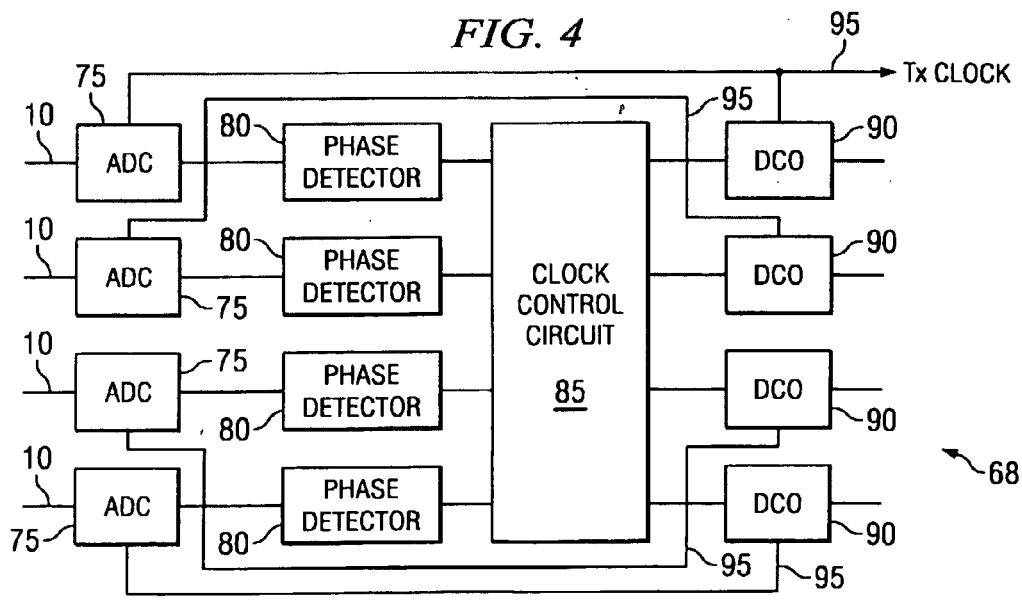
FIG. 4 is a block diagram of a multi-channel slave system according to the method of the present invention.

While FIG. 3 illustrates a single channel baud-rate system, FIG. 4 illustrates a multi-channel baud-rate timing recovery system 68. The multi-channel baud-rate timing recovery system 68 comprises a receiver that is slaved to corresponding transmitters (not shown). The multi-channel baud-rate timing recovery system 68 has frequency aligned Transmit clocks where each Receive channel has a separate independent phase and a frequency aligned Receive clock signal 95 from an associated oscillator 90. The frequency alignment of the Receive clock signals is formed in a novel fashion such that any frequency adjustments are performed synchronously across all the Rx channels resulting in the reduction of ECHO and NEXT canceller misadjustment.

Figure 5:
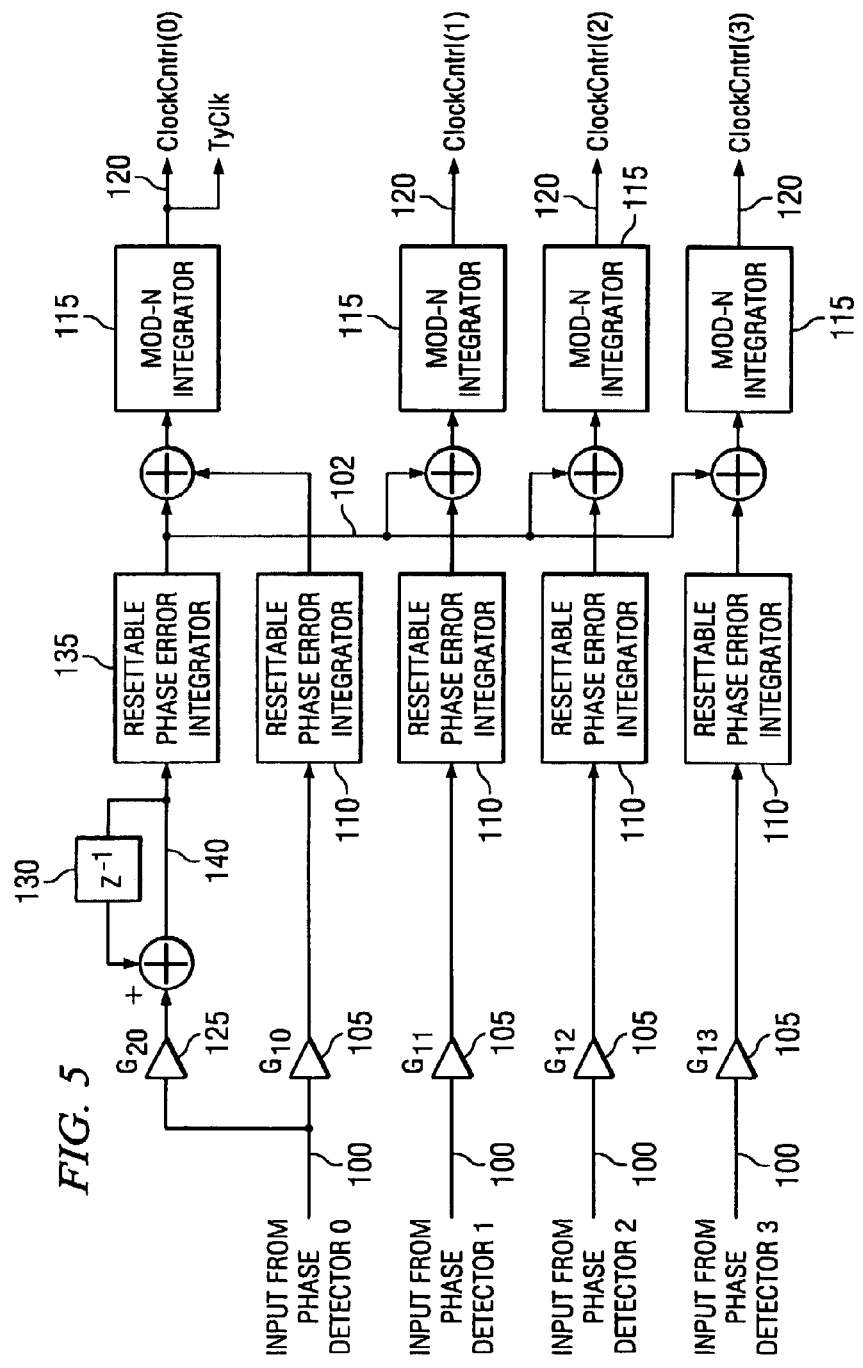
FIG. 5 is a block diagram of the circuitry for providing slave clock control according to the method of the present invention.

Referring now to FIG. 5, there is illustrated a block diagram of a particular embodiment of the clock control circuit 85 of the present invention. Phase error signals generated by the phase detectors 80 are provided as inputs 100 on each channel 102 of the clock control circuit 85. On each channel 102, an input signal is amplified at amplifier 105 to provide a proportional output ($G_{10}$, $G_{11}$, $G_{12}$, $G_{13}$) used to drive a resettable phase error integrator 110. The resettable phase error integrator 110 accumulates the phase error input 100 multiplied by the proportional gain output provided by amplifier 105 until it reaches a programmed threshold. Once the integrator 110 reaches the programmed threshold it outputs a unit pulse for a one period duration and resets to zero before continuing to accumulate inputs received from the amplifier 105.

Referring now to FIG. 4, there is illustrated a block diagram of a particular embodiment of the clock control circuit 85 of the present invention. Phase error signals generated by the phase detectors 80 are provided as inputs 100 on each channel 102 of the clock control circuit 85. On each channel 102, an input signal is amplified at amplifier 105 to provide a proportional output ($G_{10}$, $G_{11}$, $G_{12}$, $G_{13}$) used to drive a resettable phase error integrator 110 The resettable phase error integrator 110 accumulates the phase error input 100 multiplied by the proportional gain output provided by amplifier 105 until it reaches a programmed threshold. Once the integrator 110 reaches the programmed threshold it outputs a unit pulse for a one period duration and resets to zero before continuing to accumulate inputs received from the amplifier 105.

The pulses from the integrator 110 are accumulated by a Modulo-N integrator 115 The Modula-N integrator 115 provides a clock control signal 120 for selecting one of the N sampling phases from the N-tap digitally controlled oscillator 90 (FIG. 4), which generates the properly synchronized clock signal 95 to the A/D converter 75.

A separate output for application to each channel's modulo-N integrator 115 (FIG. 5) is generated by multiplying the input from phase detector zero by a second gain, $G_{20}$, at amplifier 125 and integrating the results thereof at integration circuitry 130 to provide the integrated output at 140. The output of the integration circuitry 130 is proportional to the frequency offset between the master transmitter and the slave receiver clocks While FIG. 5 has described the use of an integrated $G_{20}$ derived from a single output from one of the phase detectors 80, alternatively, an average of the integrated outputs of each channel phase detector's may be used.

Integrated output 140 is used to drive an additional resettable phase error integrator 135 The integrator 135 accumulates the integrated outputs 140 until a threshold value is reached and provides a unit pulse output for one period of duration The output of the phase error integrator 135 is added to the outputs of the resettable phase error integrator 110 and is provided to each of the Modulo-N integrators 115. This provides frequency correction to each of the channels 102 and the local transmit clock. As a result, the frequency updates for the Receive clocks are synchronized with the transmit clocks The ability to synchronize the frequency updates of the Receive clock (and hence the transmit clocks) allows the transmit and receive clocks to be aligned during frequency adjustment and eliminates potential ECHO and NEXT canceller transients.

Figure 6:
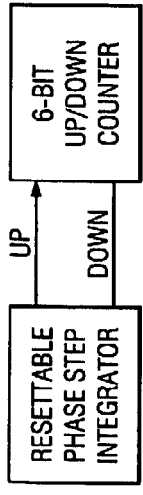
FIG. 6 is a block diagram of an alternate embodiment of the present invention

It should be noted that several alternatives exist for implementing the above-described functions In an alternative embodiment, the use of a resettable integrator 140 with an up/down converter 145 (as shown in FIG. 5) to implement the same functions as those described above may be utilized as shown in FIG. 6. This would also meet the goal of propagating the adjustments required for frequency recovery in a synchronous fashion across all the channels.

The previous description is of a preferred embodiment for implementing the invention, and the scope of the invention should not necessarily be limited by this description. The scope of the present invention is instead defined by the following claims.

What is claimed is:

1. A clock control circuit for use in a multi-channel baud-rate timing recovery loop, comprising:
   a plurality of first amplifiers each generating proportional outputs responsive to input from a corresponding one of a plurality of phase detectors;
   a plurality of first resettable phase error integrators each connected to one of the plurality of first amplifiers for accumulating proportional outputs until a programmable threshold is reached, said resettable phase error integrators outputting a pulse and resetting responsive to reaching said programmable threshold;
   at least one second amplifier for generating a second output responsive to input from at least one of the plurality of phase detectors;
   an integrator for integrating the second output to generate an integrating output proportional to a frequency offset;
   a second resettable phase error integrator for accumulating integrating outputs until a second programmable threshold is reached, said second resettable phase integrators outputting a pulse and resetting responsive to reaching said second programmable threshold; and
   a plurality of Mod-N integrators for generating a frequency and phase corrected clock control signal to select an N sampling phase of N-tap digitally controlled oscillators responsive to outputs of the plurality of first resettable phase error integrator and the second resettable phase error integrator.

2. The clock control circuit of claim 1, wherein the plurality of Mod-N integrators further sums the outputs of the plurality of first resettable phase error integrators with the outputs of the second resettable phase error integrator to generate a frequency and phase corrected signal.

3. The clock control circuit of claim 1, wherein the at least one second amplifier for generating a second output is responsive to an average output from a plurality of phase detectors.

4. The clock control circuitry of claim 1, wherein the at least one amplifier for generating a second integrating output is responsive to an output from a single phase detector.

5. A clock control circuit for use in a multi-channel baud-rate timing recovery loop, comprising:
   first circuitry for generating a proportional output responsive to an input from at least one phase detector;
   second circuitry for generating an integrating output responsive to an input from the at least one phase detector;

a plurality of resettable phase error integrators connected to the first circuitry and the second circuitry for accumulating outputs until a programmable threshold is reached, said plurality of resettable phase error integrators outputting a pulse and resetting responsive to reaching said programmable threshold level; and a plurality of Mod-N integrators for generating a clock control signal to select an N sampling phase of an N-tap digitally controlled oscillator responsive to outputs of the plurality of resettable phase error integrators.

6. The clock control circuit of claim 5, wherein the first circuitry, further comprises a plurality of amplifiers each generating proportional outputs responsive to input from a phase detector.

7. The clock control circuit of claim 5, wherein the second circuitry further comprises:

at least one amplifier for generating a second output responsive to input from at least one phase detector; and an integrator for integrating the second output to generate an integrating output proportional to a frequency offset.

8. The clock control circuit of claim 7, wherein the at least one amplifier for generating a second output is responsive to an average output from a plurality of phase detectors.

9. The clock control circuit of claim 7 wherein the at least one amplifier for generating a second output is responsive to an output from a single phase detectors.

10. The clock control circuit of claim 5, wherein the plurality of resettable phase error integrators further comprises:

a plurality of first resettable phase error integrators each connected to the first circuitry for accumulating proportional outputs until a programmable threshold is reached, said resettable phase error integrators outputting a pulse and resetting responsive to reaching said programmable threshold; and a second resettable phase error integrator connected to the second circuitry for accumulating integrating outputs until a second programmable threshold is reached, said second resettable phase integrator outputting a pulse and resetting responsive to reaching said second programmable threshold.

11. The slave clock control circuit of claim 5, wherein the plurality of Mod-N integrators further sums the outputs of the plurality of first resettable phase error integrators with the outputs of the second resettable phase error integrator to generate a frequency and phase corrected signal.

12. An N-channel baud-rate timing recovery loop, comprising:

at least one A/D converter;

at least one phase detector connected to receive an output from the at least one A/D converter;

a slave control circuit responsive to a phase error signal output from the at least one phase detector for generating at least one clock control signal, wherein said slave control circuit includes a Mod-N integrator for generating the at least one clock control signal and propagates adjustments required for frequency correction in a synchronous fashion across all of the N-channels; and at least one N-tap digitally controlled oscillator responsive to the at least one clock control signal to select an N sampling phase and generate a clock signal for feedback to the at least one A/D converter.

13. The N-channel baud-rate timing recovery loop of claim 12, wherein the slave control circuit further comprises:

a plurality of first amplifiers each generating proportional outputs responsive to input from a corresponding one of a plurality of phase detectors;

a plurality of first resettable phase error integrators each connected to one of the plurality of first amplifiers for accumulating proportional outputs until a programmable threshold is reached, said resettable phase error integrators outputting a pulse and resetting responsive to reaching said programmable threshold;

at least one second amplifier for generating a second output responsive to input from at least one of the plurality of phase detectors;

an integrator for integrating the second output to generate an integrating output proportional to a frequency offset; and a second resettable phase error integrator for accumulating integrating outputs until a second programmable threshold is reached, said second resettable phase error integrators outputting a pulse and resetting responsive to reaching said second programmable threshold; and a plurality of Mod-N integrators for generating the clock control signal to select an N sampling phase of a corresponding plurality of N-tap frequency and phase corrected digitally controlled oscillators responsive to outputs of the plurality of the first resettable phase error integrators and the second resettable phase error integrator.

14. The N-channel baud-rate timing recovery loop of claim 13, wherein the plurality of Mod-N integrators further sums the outputs of the plurality of first resettable phase error integrators with the outputs of the second resettable phase error integrator to generate a frequency and phase corrected signal.

15. The N-channel baud-rate timing recovery loop of claim 13, wherein the at least one amplifier for generating a second output is responsive to an average output from a plurality of phase detectors.

16. The N-channel baud-rate timing recovery loop of claim 13, wherein the at least one amplifier for generating a second output is responsive to an output from a single phase detector.

17. The N-channel baud-rate timing recovery loop of claim 12, wherein the slave control circuit further comprises:

first circuitry for generating a proportional output responsive to an input from at least one phase detector;

second circuitry for generating an integrating output responsive to an input from at least one phase detector;

a plurality of resettable phase error integrators connected to the first circuitry and the second circuitry for accumulating proportional outputs or integrating outputs until a programmable threshold is reached, said plurality of resettable phase error integrators outputting a pulse and resetting responsive to reaching said threshold level; and a plurality of Mod-N integrators for generating the clock control signal to select an N sampling phase of a corresponding plurality of N-tap digitally controlled oscillator responsive to outputs of the plurality of resettable phase error integrators.

18. The N-channel baud-rate timing recovery loop of claim 17, wherein the first circuitry, further comprises a plurality of amplifiers each generating proportional outputs responsive to input from a phase detector.

19. The N-channel baud-rate timing recovery loop of claim 17, wherein the second circuitry further comprises:

at least one amplifier for generating a second output responsive to input from at least one phase detector; and an integrator for integrating the second output to generate an integrating output proportional to a frequency offset.

20. The N-channel baud-rate timing recovery loop of claim 19, wherein the at least one amplifier for generating a second output is responsive to an average output from a plurality of phase detectors.

21. The N-channel baud-rate timing recovery loop of claim 19, wherein the at least one amplifier for generating a second output is responsive to an output from a single phase detectors.

22. The N-channel baud-rate timing recovery loop of claim 17, wherein the plurality of resettable phase error integrators further comprises:

a plurality of first resettable phase error integrators each connected to the first circuitry for accumulating proportional outputs until a programmable threshold is reached, said resettable phase error integrators outputting a pulse and resetting responsive to reaching said programmable threshold; and a second resettable phase error integrator connected to the second circuitry for accumulating integrating outputs until a second programmable threshold is reached, said second resettable phase error integrators outputting a pulse and resetting responsive to reaching said second programmable threshold.

23. The N-channel baud-rate timing recovery loop of claim 17, wherein the plurality of Mod-N integrators further sums the outputs of the plurality of first resettable phase error integrators with the output of the second resettable phase error integrator to generate a frequency corrected signal.

24. The N-channel baud-rate timing recovery loop of claim 12, wherein the oscillator comprises a digitally controlled oscillator.

* * * * *

UNITED STATES PATENT AND TRADEMARK OFFICE
CERTIFICATE OF CORRECTION

PATENT NO. : 7,110,485 B2
APPLICATION NO. : 10/256991
DATED : September 19, 2006
INVENTOR(S) : Roger K. Bertschmann et al.

It is certified that error appears in the above-identified patent and that said Letters Patent is hereby corrected as shown below:

Column 1, line 11    Replace "system"
                     With --system.--

Column 2, lines 6-7  Replace "misadjustment  Thus"
                     With --misadjustment.  Thus--

Column 2, line 23    Replace "levels  A plurality"
                     With --levels.  A plurality--

Column 2, line 55    Replace "35 Phase"
                     With --35.  Phase--

Signed and Sealed this

Fourth Day of September, 2007

JON W. DUDAS
*Director of the United States Patent and Trademark Office*